(12) United States Patent
Cadouri

(10) Patent No.: US 7,220,605 B1
(45) Date of Patent: May 22, 2007

(54) SELECTING DICE TO TEST USING A YIELD MAP

(75) Inventor: Eitan Cadouri, Cupertino, CA (US)

(73) Assignee: PDF Solutions, Inc., San Jose, CA (US)

( * ) Notice: Subject to any disclaimer, the term of this patent is extended or adjusted under 35 U.S.C. 154(b) by 477 days.

(21) Appl. No.: 10/902,245

(22) Filed: Jul. 28, 2004

Related U.S. Application Data

(63) Continuation-in-part of application No. 10/854,970, filed on May 26, 2004.

(51) Int. Cl.
*H01L 21/66* (2006.01)

(52) U.S. Cl. .................. 438/14; 700/121; 257/E21.521

(58) Field of Classification Search .................... 438/5, 438/14; 700/90, 95, 17, 121; 257/E21.521, 257/E21.525, E21.529
See application file for complete search history.

(56) References Cited

U.S. PATENT DOCUMENTS

| | | | |
|---|---|---|---|
| 6,393,602 B1 * | 5/2002 | Atchison et al. | 716/4 |
| 7,013,192 B2 * | 3/2006 | Whitefield et al. | 700/105 |

* cited by examiner

*Primary Examiner*—Scott B. Geyer
(74) *Attorney, Agent, or Firm*—Morrison & Foerster LLP

(57) ABSTRACT

Dice on a wafer are selected to be tested using a yield map. The yield map incorporates yield information of different products produced by the same fabrication process. A die placement for a product to be produced by the same process is determined based on the yield map. An expected yield for a die in the die placement is also determined based on the yield map. The expected yield for the die is then used to determine whether to test the die.

40 Claims, 7 Drawing Sheets

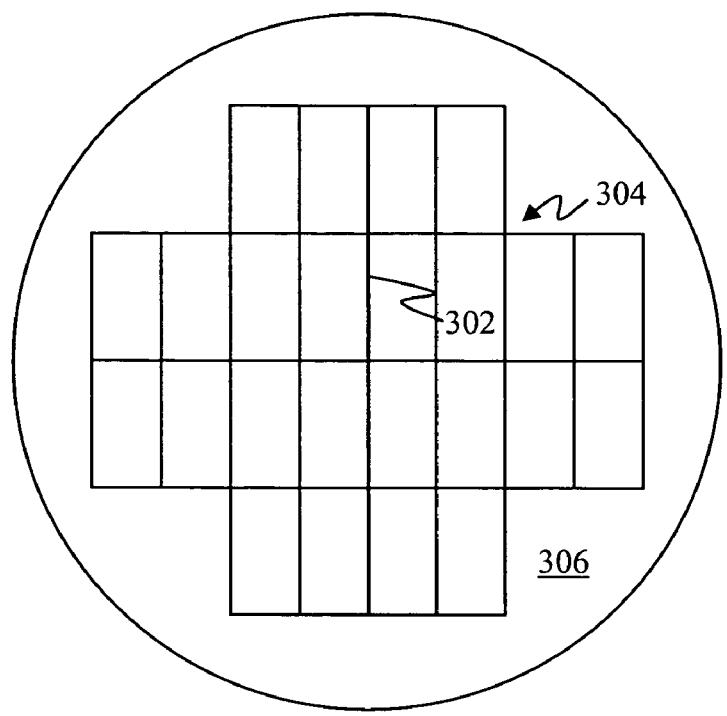
FIG. 3-A
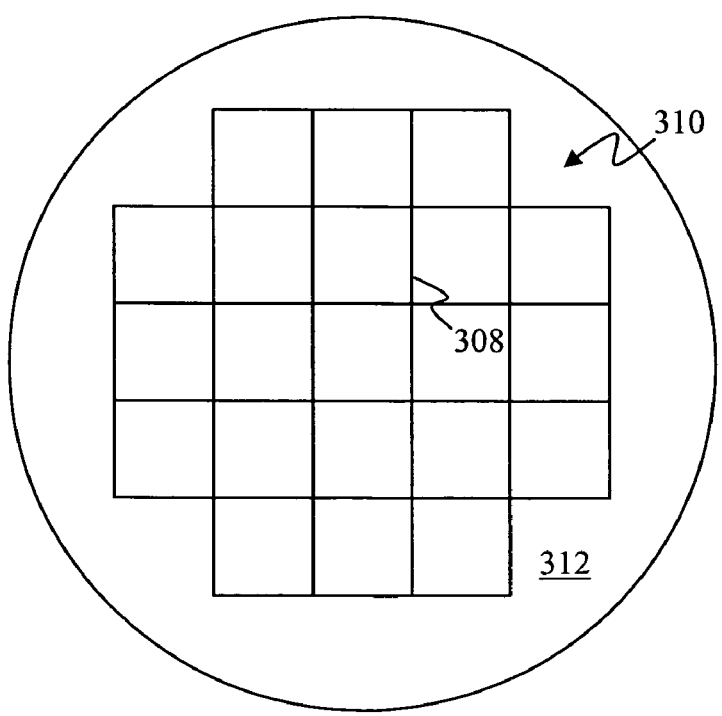
FIG. 3-B

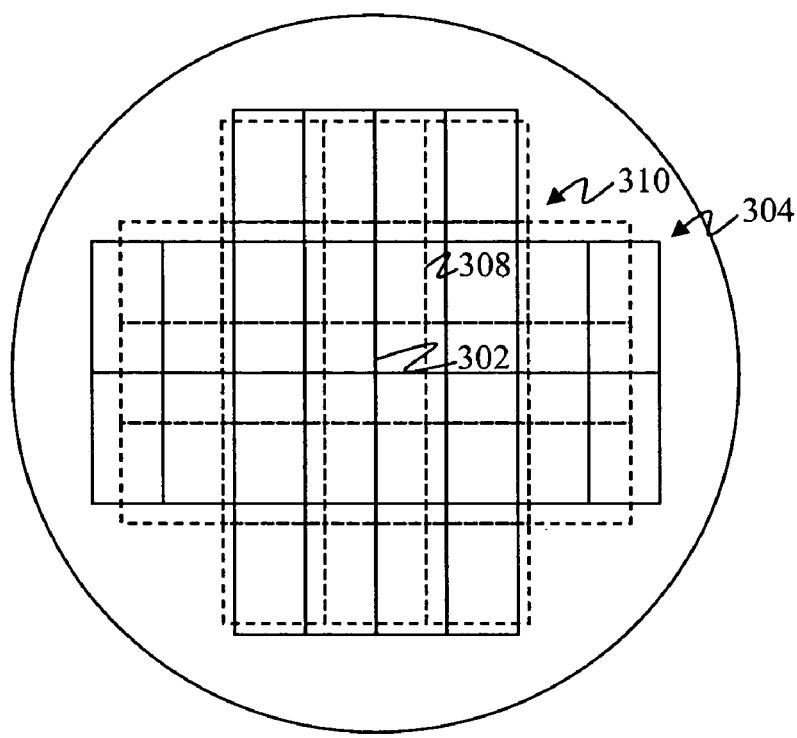
FIG. 3-C
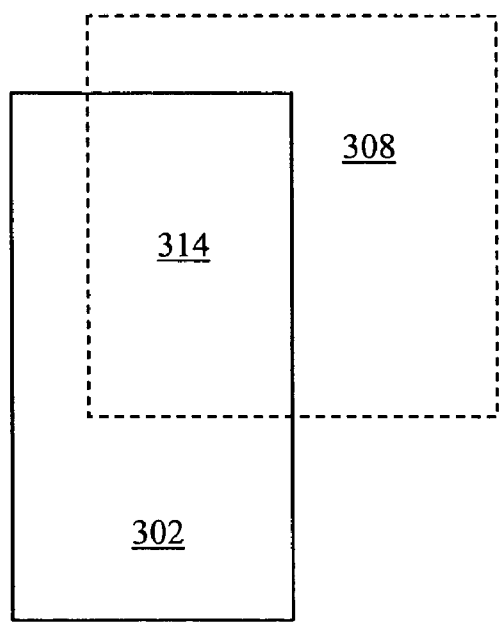
FIG. 3-D

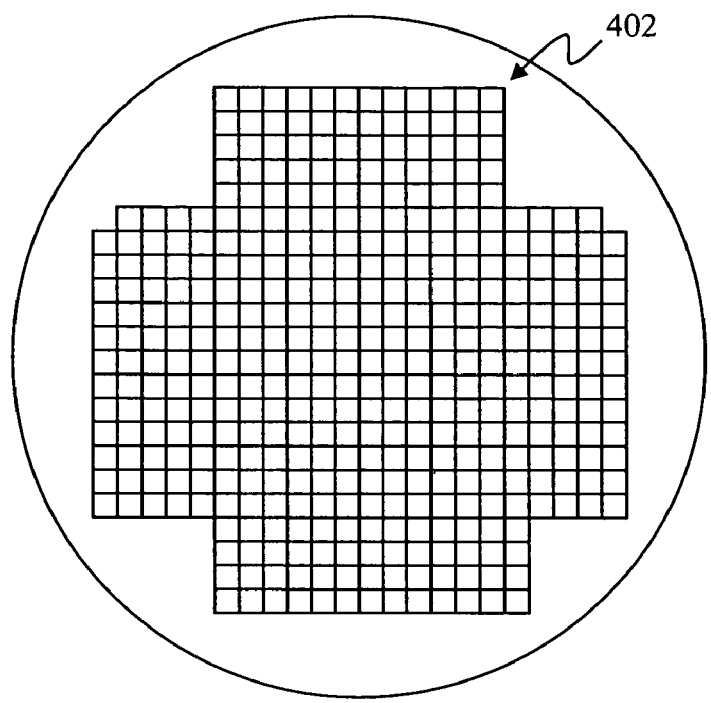
FIG. 4-A
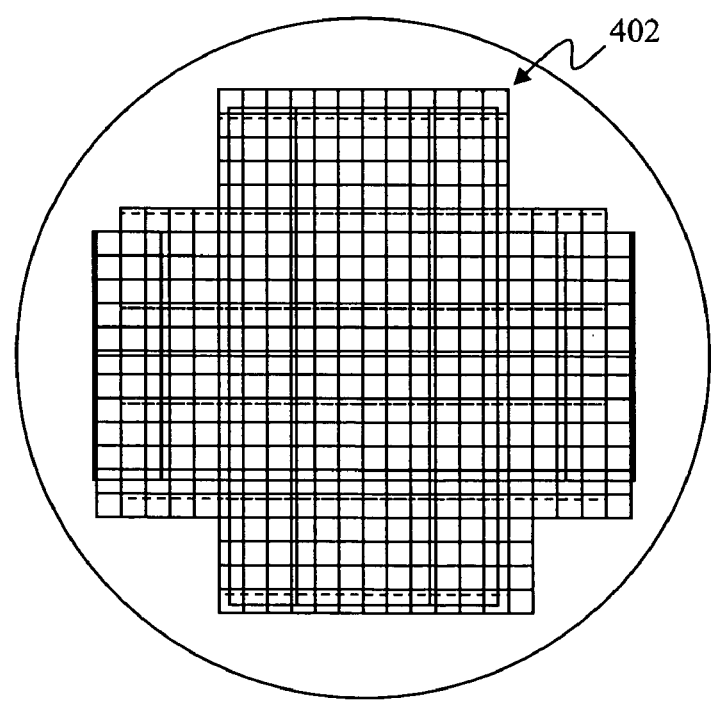
FIG. 4-B

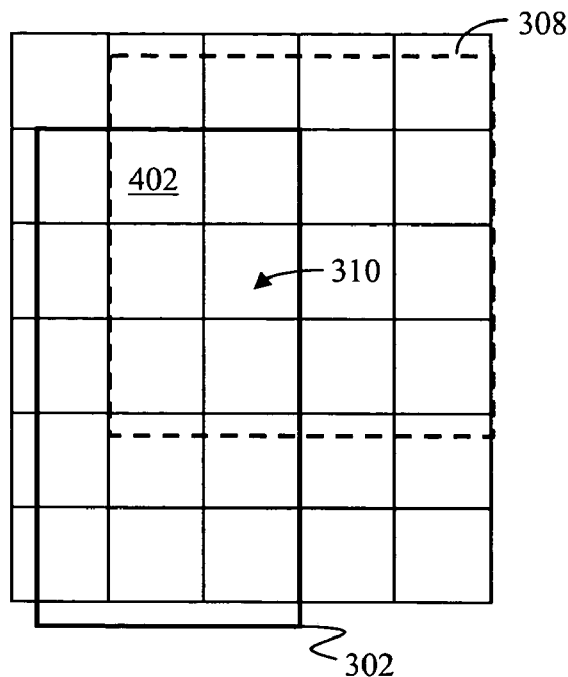
FIG. 4-C
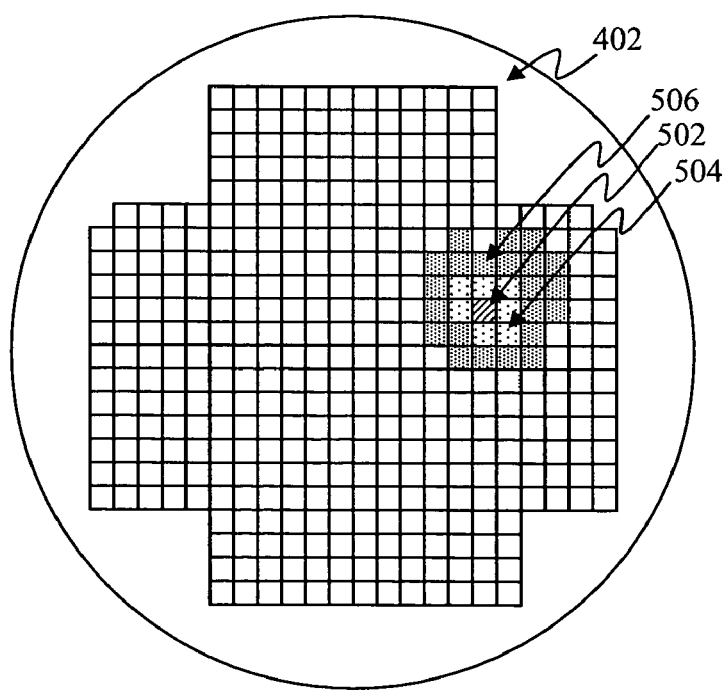
FIG. 5

SELECTING DICE TO TEST USING A YIELD MAP

CROSS REFERENCE TO RELATED APPLICATION

This application is a continuation-in-part of application Ser. No. 10/854,970, titled MAPPING YIELD INFORMATION OF SEMICONDUCTOR DICE, filed May 26, 2004, the entire content of which is incorporated here by reference.

BACKGROUND

1. Field

The present application relates to semiconductor dice manufacturing, and more particularly to selecting dice to be test using a yield map.

2. Related Art

Semiconductor devices are typically manufactured by fabricating the devices on a semiconductor wafer. An individual device is formed as a die on the wafer using known semiconductor fabrication processes. Depending on the size of the die, a single wafer can contain hundreds of dice. The dice are generally arranged in a pattern (i.e., a die placement) on the wafer to maximize the number of dice on the wafer.

After the dice are fabricated on the wafer, the dice are electrically tested. Dice that pass the electrical testing are sorted from the dice that fail the electrical testing. The cost of testing can contribute to 30 percent and more of the overall cost of the devices. Semiconductor manufacturers are increasingly performing comprehensive testing of dice, meaning that each die is tested, while the dice are still on the wafer. This process enables the manufacturers to track the locations of the dice that fail or have low yield. However, performing comprehensive testing of dice increases the overall test time and cost.

In one approach to reducing the amount of time needed and cost associated with testing, areas on a wafer that are found to have high yields are no longer tested. For example, after testing dice on a number of wafers, if an area is found to have a high yield, such as greater than 90 percent, dice in that area are no longer tested in subsequent wafers. One shortcoming to this approach, however, is that the fabrication process can drift, which can decrease the yield of the dice in the area not being tested. However, for the very reason that dice in this area are not being tested, the change in the fabrication process and the yield of these dice may go undetected.

SUMMARY

In one exemplary embodiment, dice on a wafer are selected to be tested using a yield map. The yield map incorporates yield information of different products produced by the same fabrication process. A die placement for a product to be produced by the same process is generated based on the yield map. An expected yield for a die in the die placement is determined based on the yield map. The expected yield for the die is then used to determine whether to test the die.

DESCRIPTION OF DRAWING FIGURES

The present application can be best understood by reference to the following description taken in conjunction with the accompanying drawing figures, in which like parts may be referred to by like numerals:

Figure 6:
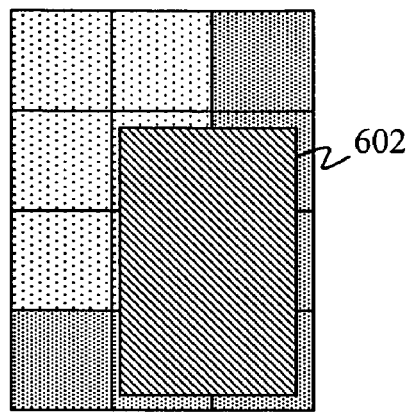
Figure 7:
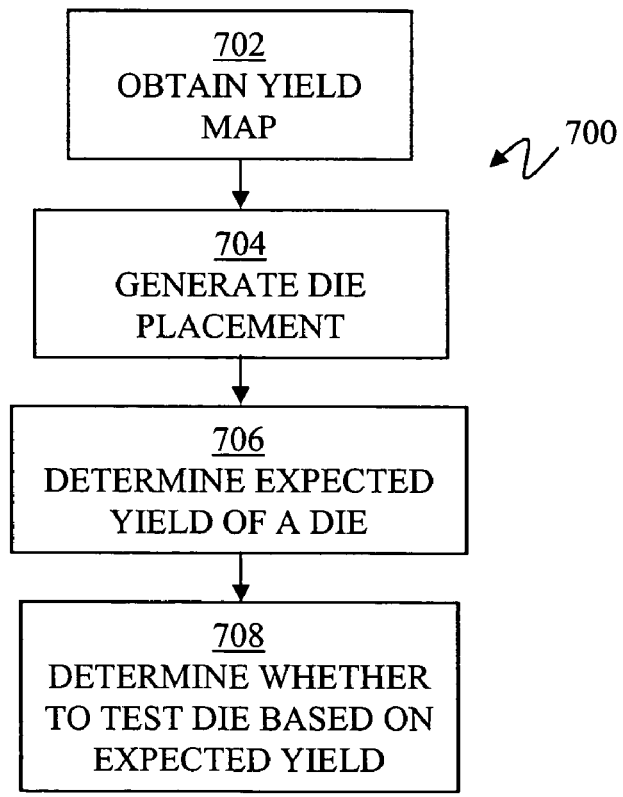
Figure 8:
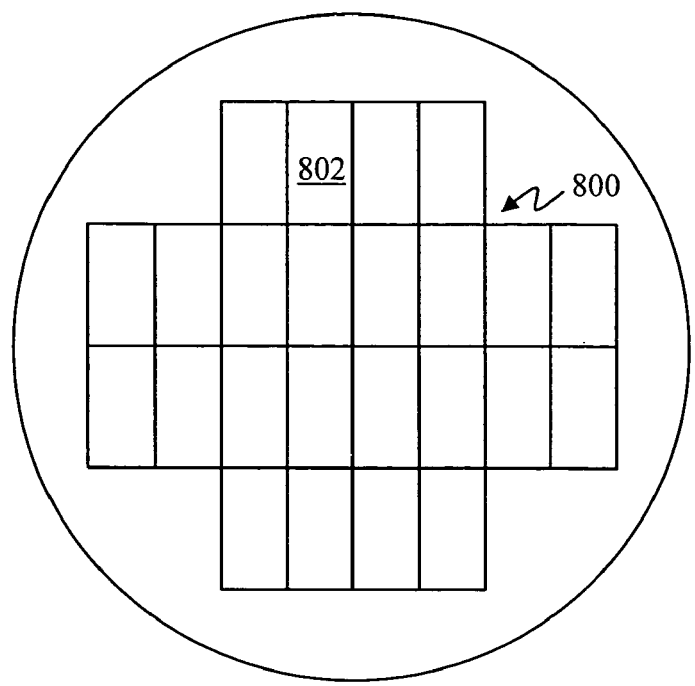

FIG. 3-A is a top view of an exemplary wafer having dice arranged in accordance with an exemplary die placement;

FIG. 3-B is a top view of another exemplary wafer having dice arranged in accordance with another exemplary die placement;

FIG. 3-C depicts the exemplary die placement depicted in FIG. 3-A superimposed with the exemplary die placement depicted in FIG. 3-B;

FIG. 3-D depicts a portion of FIG. 3-C;

FIG. 4-A depicts exemplary pixel elements;

FIG. 4-B depicts the exemplary pixel elements depicted in FIG. 4-A superimposed with the exemplary die placement depicted in FIG. 3-A and the exemplary die placement depicted in FIG. 3-B;

FIG. 4-C depicts a portion of FIG. 4-B;

FIG. 5 depicts exemplary groupings of pixel elements;

FIG. 6 depicts an exemplary die placed with the pixel elements;

FIG. 7 depicts an exemplary process of selecting dice to test;

FIG. 8 depicts an exemplary die placement; and

Figure 9:
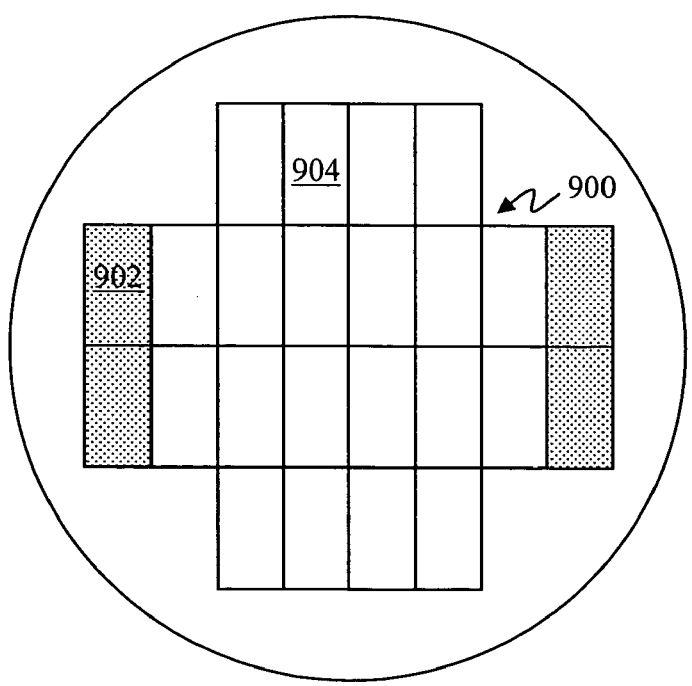

FIG. 9 depicts an exemplary test pattern.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

Figure 1:
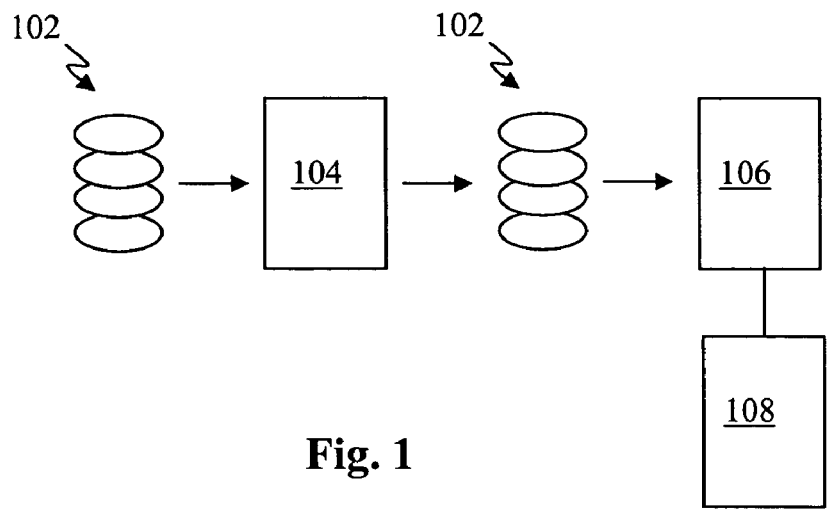
FIG. 1 is a block diagram of an exemplary semiconductor manufacturing and testing process.

With reference to FIG. 1, a plurality of semiconductor wafers 102 can be processed using a processing tool 104 to form integrated circuits as dice on wafers 102. After the dice are formed on wafers 102, a tester 106 performs one or more tests on the dice. In general, dice that fail the one or more tests are marked and discarded. Yield information, such as the number of dice that pass or fail the one or more tests, can be used to monitor, adjust, and optimize processing tool 104. It should be recognized that wafers 102 can be processed using any number of processing tools, and tested using any number of testers.

Figure 2:
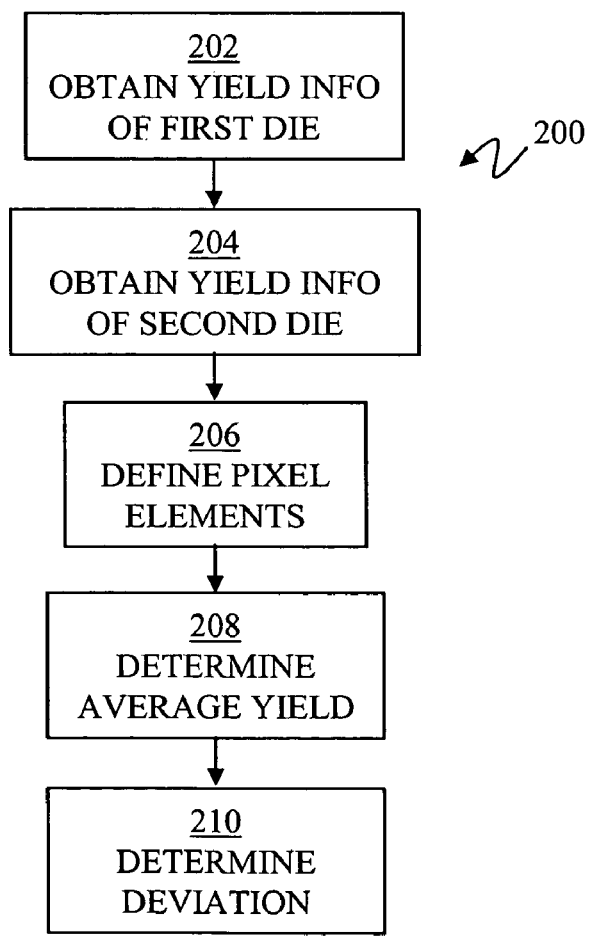
FIG. 2 is a flow diagram of an exemplary process of mapping yield information of semiconductor dice.

With reference to FIG. 2, an exemplary process 200 is depicted of mapping yield information of dice. In step 202, yield information of a first die that was formed on a first location on a first wafer is obtained. For example, with reference to FIG. 3-A, assume a plurality of dice 302 are formed on a wafer 306. As depicted in FIG. 3-A, dice 302 can be arranged on locations on wafer 306 in accordance with a die placement 304. Thus, in this example, in accordance with step 202 (FIG. 2), after a die is formed on wafer 306, the die is tested, and yield information, such as whether the die passed the test, is obtained.

With reference to FIG. 2, in step 204, yield information of a second die that was formed on a second location on a second wafer is obtained. For example, with reference to FIG. 3-B, assume a plurality of dice 308 are formed on a wafer 312. As depicted in FIG. 3-B, dice 308 can be arranged on locations on wafer 312 in accordance with a die placement 310. Thus, in this example, in accordance with step 204 (FIG. 2), after a die is formed on wafer 312, the die is tested, and yield information, such as whether the die passed the test, is obtained.

With reference to FIGS. 3-A and 3-B, in one exemplary embodiment, a portion of the first location of the first die (such as one of the plurality of dice 302 formed on wafer 306) corresponds to a portion of the second location of the second die (such as one of the plurality of dice 308 formed on wafer 312) such that the portion of the first location would overlap with the portion of the second location if the first location was on the second wafer. For example, with reference to FIG. 3-C, die placement 304 is depicted superimposed with die placement 310. As depicted in FIG. 3-C, the locations of dice 302 overlap with the locations of dice 308. More particularly, with reference to FIG. 3-D, one die 302 from die placement 304 (FIG. 3-C) is depicted with one die 308 from die placement 310 (FIG. 3-C). As depicted in FIG. 3-D, a portion of the location of die 302 overlaps with a portion of the location of die 308, which is depicted as location 314.

In the present exemplary embodiment, as depicted in FIGS. 3-A to 3-D, the first die and the second die can have different sizes. As also depicted in FIGS. 3-A to 3-D, the first die and the second die can have different placements (e.g., die placement 304 is different than die placement 310). Additionally, the first die and the second die can be different products produced by the same process (e.g., wafer 306 and wafer 312 can be processed using the same processing tool 104 (FIG. 1)).

With reference to FIG. 2, in step 206, a plurality of pixel elements are defined. Each pixel element corresponds to a different location on a wafer, and at least one of the pixel elements corresponds to the portion of the first location of the first die that corresponds to the portion of the second location of the second die. For example, with reference to FIG. 4-A, a plurality of pixel elements 402 are depicted. As depicted in FIG. 4-A, each pixel element 402 corresponds to a different location on a wafer. With reference to FIG. 4-B, plurality of pixel elements 402 is depicted superimposed with die placement 304 (FIG. 3-A) and die placement 310 (FIG. 3-B). With reference to FIG. 4-C, a portion of plurality of pixel elements 402 are depicted superimposed on one die 302 from die placement 304 (FIG. 3-A) and one die 308 from die placement 310 (FIG. 3-B). As depicted in FIG. 4-C, at least one pixel element 402 corresponds to the portion of the location of die 302 that overlaps with the portion of the location of die 308.

With reference to FIG. 2, in step 208, an average yield for the at least one pixel element from step 206 is determined based on the yield information of the first die and the second die obtained in steps 202 and 204. For example, with reference to FIG. 4-C, assume that the yield of die 302 is 20 percent and the yield of die 308 is 10 percent, then the average yield of pixel element 402 in the location of die 302 that overlaps with the location of die 308 is 15 percent. It should be recognized that yield information can be obtained in various forms. For example, yield information can be obtained from a semiconductor manufacturer in a publishable form, such as normalized values. For a more detailed description of transforming yield information, see U.S. patent application Ser. No. 10/803,787, titled TRANSFORMING YIELD INFORMATION OF A SEMICONDUCTOR FABRICATION PROCESS, filed Mar. 17, 2004, which is incorporated herein by reference in its entirety.

It should also be recognized that the yield information of the first die and the second die obtained in steps 202 and 204 can be transformed before determining the average yield in step 208. For example, if the yield information obtained in steps 202 and 204 are not normalized, a normalization step can be included prior to determining the average yield in step 208. The yield information of the first die and the second die can be normalized using a linear or nonlinear function that takes into account average yield.

In some circumstances, determining the average yield in step 208 based on normalized yields rather than actual yields can more accurately characterize the performance of the fabrication process. For example, assume that the yield information obtained in steps 202 and 204 for the first die and the second die are the actual yields of the first die and the second die. As a numerical example, assume that the first die is formed on 100 wafers and tested, and only 10 of the 100 dice passed, which corresponds to an actual yield of 10 percent. Assume that the second die is also formed on 100 wafers and tested, and 90 of the 100 dice passed, which corresponds to an actual yield of 90 percent. Thus, the average yield determined based on the actual yields of the first die and the second is 50 percent. Now assume that 100 of the first die are fabricated on each of the 100 wafers, and 1,100 of the 10,000 dice passed, which corresponds to an average yield for the first die of 11 percent. Thus, the normalized yield of the first die is about 91 percent. Assume that 100 of the second die are fabricated on each of the 100 wafers, and 9,200 of the 10,000 dice passed, which corresponds to an average yield for the second die of 92 percent. Thus, the normalized yield of the second die is about 98 percent. The average yield based on the normalized yields is 94.5 percent. Now assume that the first die and the second die are different products produced by the same fabrication process. If the low actual yield of the first die and the high actual yield of the second die are primarily related to the difference in design of the first die and the second die (e.g., the features and acceptable tolerances of the first die may be smaller in comparison to the second die), the average yield determined based on the normalized yields (i.e., 94.5 percent) is a more accurate characterization of the performance of the fabrication process than the average yield determined based on the actual yields (i.e., 50 percent).

With reference to FIG. 2, in step 210, a deviation for the at least one pixel element from step 206 is determined based on the average yield determined in step 208 and the yield information of the first die and the second die obtained in steps 202 and 204. For example, with reference to FIG. 4-C, assuming that the average yield of pixel element 402 is 15 percent, the yield of 302 is 20 percent and the yield of die 308 is 10 percent, then the deviation is 5 percent. Although in this example a standard deviation was used as a measure of deviation, it should be recognized that various measures of deviation or variation can be used.

In one exemplary implementation, with reference to FIG. 2, step 202 can be repeated to obtain yield information of a first set of dice formed on locations on the first wafer, such as dice 302 of die placement 304 (FIG. 3-A). Step 204 can be repeated to obtain yield information of a second set of dice formed on locations on the second wafer, such as dice 308 of die placement 310 (FIG. 3-B). In the present exemplary embodiment, as depicted in FIG. 3-C, the locations on the first wafer can correspond with locations on the second wafer such that the locations on the first wafer would overlap with locations on the second wafer if the locations on the first wafer were on the second wafer. As depicted in 4-B, the plurality of pixel elements 402 correspond to the overlapping locations.

In the present exemplary implementation, an average yield for each of the plurality of pixel elements 402 is determined based on the yield information of the first set of dice (dice 302 of die placement 304 (FIG. 3-A)) and the second set of dice (dice 308 of die placement 304 (FIG. 3-B)). A deviation for each of the plurality of pixel elements 402 is also determined based on the yield information of the first set of dice (dice 302 of die placement 304 (FIG. 3-A)) and the second set of dice (dice 308 of die placement 304 (FIG. 3-B)).

In one exemplary implementation, with reference to FIG. 2, steps 202 and 204 can be repeated to obtain yield information of a plurality of additional sets of dice formed on locations on a plurality of additional wafers, where the locations on the plurality of additional wafers overlap. The plurality of additional sets of dice can be of different products, which can include tens, hundreds, and thousands of different products, produced using the same fabrication process. The plurality of pixel points defined in step 206 correspond to the overlapping locations. The average yield and the deviation for each of the plurality of pixel elements are determined based on the yield information of the plurality of additional sets of dice.

In the present exemplary implementation, the average yield for a pixel element is determined as a sum of the yield information of all the dice in a location corresponding to the pixel element divided by the number of dice in the location. The deviation for the pixel is determined as a percentage of deviation of the yield information of all the dice in the location.

With reference to FIG. 5, in the present exemplary embodiment, after average yields and deviations are determined for the plurality of pixel elements 402, a location of interest is identified. The location of interest can correspond to a location on a wafer that interacts with a processing equipment used to process the wafer, such as a clamp, wafer scribe, wafer identification, nitride injector, and the like. The location of interest can correspond to a location on a wafer specified by a user. The location of interest can also correspond to a pixel element having an average yield that is less than an established limit.

After a location of interest is identified, pixel elements around the identified location of interest are grouped based on the average yield and deviation of the pixel elements. For example, pixel elements can be grouped together that have: 1) the same average yields and deviations; 2) the same average yield and deviations within ranges of values; 3) average yields within ranges of values and the same deviations; or 4) average yields and deviations within ranges of values. The grouping of pixel elements around the location of interest can be ceased when the average yields or the deviations of the pixel elements are greater than an established limit.

For example, as depicted in FIG. 5, assume that a location of interest 502 is identified. Assume that pixel elements around location of interest 502 that have average yields within ranges of values and the same deviations are grouped together. For example, assume that a first grouping of pixel elements 504 includes pixel elements with yields between 0 and 10 percent and a deviation of 0 percent. Assume also that a second grouping of pixel elements 506 includes pixel elements with yields greater than 10 and less than 20 percent and a deviation of 10 percent. In this manner, the plurality of pixel elements 402 can be divided into different zones by grouping pixel elements 402 around locations of interest.

In the present exemplary embodiment, the pixel elements can be used in determining a placement of a die. In particular, the average yield and deviation associated with the pixel elements in the location in which the die is to be place can predict the likely yield of the die in that location. For example, with reference to FIG. 6, a die 602 is depicted as being placed in a selected location. The predicted yield of die 602 at the selected location can be determined based on the average yield and deviation associated with the pixel elements in the location.

As depicted in FIG. 6, in the present exemplary embodiment, if the pixel elements in the selected location have different average yields, then the average yield associated with the lowest deviation is selected. For example, die 602 is depicted as being placed in a selected location with two groupings of pixel elements—one grouping with yields between 0 and 10 percent and a deviation of 0 percent, and another grouping with yields greater than 10 and less than 20 percent and a deviation of 10 percent. Thus, in the present example, the average yield selected as predicting the yield of die 602 is between 0 and 10 percent.

Additionally, in the present exemplary embodiment, if the pixel elements in the selected location have different average yields and the deviations of the pixel elements are the same or within a determined range, the average yields of the pixel elements are averaged. For example, assume that one grouping of pixel elements in FIG. 6 has a yield of 99 percent and a deviation of 0.56, and another grouping of pixel elements has a yield of 80 percent and a deviation of 0.57. Assume also that the determined range is 0.05. Thus, in the present example, the predicted yield of die 602 is 89.5 percent (the average of 99 percent and 80 percent).

With reference to FIG. 7, an exemplary process 700 is depicted of selecting dice to test based on a mapping of yield information (a yield map). In step 702, a yield map is obtained. As described above, in one exemplary embodiment, a yield map can be generated using exemplary process 200 (FIG. 2) based on yield information of different products produced by the same fabrication process. It should be recognized that the fabrication process used to produce the different products can include any number of individual processes, such as deposition, lithographic, etching, cleaning, and the like.

In step 704, the obtained yield map is used to generate a die placement for a product to be produced using the same fabrication process. With reference to FIG. 8, an exemplary die placement 800 of dice 802 is depicted.

With reference again to FIG. 7, in step 706, for a die in the die placement, an expected yield can be determined based on the yield map. It should be recognized that the expected yield for a die can be determined during the process of generating the die placement. For example, multiple die placements can be generated, expected yields of the dice in each of the die placements can be determined, then the die pattern with the highest yield can be selected.

In step 708, the expected yield of a die in the die placement is used to determine whether to test the die. In one exemplary embodiment, a yield threshold can be set, such as 90 percent, at which a die will not be tested. Thus, if the expected yield for the die meets or exceeds the yield threshold, the die will not be tested. It should be recognized that the yield threshold can be set at any desirable level. It should also be recognized that the yield threshold can be adjusted.

As described above, in one exemplary embodiment, locations of interest can be identified in the yield map. After the locations of interest are identified, pixel elements around the locations of interest can be grouped based on the average yield and deviation of the pixel elements.

In one exemplary embodiment, the locations of interests are then grouped together, where locations of interest in a particular group correspond to locations on a wafer that interact with the same type of processing equipment. Thus, when a die in a location on the wafer corresponding to one of the locations of interest in a group is selected to be tested, dice in locations on the wafer corresponding to the other locations of interest in the same group are also selected to be tested.

For example, assume a group of locations of interests correspond to locations on a wafer that interact with clamps (a clamp group). Thus, if a die in a location on the wafer corresponding to one of the locations of interest in the clamp group is selected to be tested, then dice in locations on the wafer corresponding to the other locations of interest in the clamp group are also selected to be tested.

A test pattern can be generated by iterating steps 706 and 708 for each die in the die placement. With reference to FIG. 9, an exemplary die pattern 900 is depicted. Dice 902 in die pattern 900 are dice to be tested. Dice 904 are dice not to be tested. Test pattern 900 can be used in a tester to select dice to be tested on a wafer.

With reference again to FIG. 7, in one exemplary embodiment, subsequent yield maps are obtained to monitor the fabrication process. A change in a subsequent yield map can indicate a change in the fabrication process that can affect the yields of the dice in the die placement. Thus, in the present exemplary embodiment, when a change in a subsequent yield map is detected, a new test pattern can be generated and used.

As described above, in one exemplary embodiment, locations of interest can be grouped together. In this exemplary embodiment, when a change is detected in a grouping of pixel elements around a location of interest in a group of locations of interest, a determination can be made as to whether to test the dice in the die placement in locations on the wafer corresponding to the locations of interest in the group. Additionally, a determination can be made as to whether to test a subset of the dice in each group of locations of interest to monitor the fabrication process.

As described above, the yield information in the yield map can be normalized yields. In one exemplary embodiment, when the yield information in the yield map are normalized yields, a normalized predicted yield for the die is determined based on the yield map with normalized yields. An average yield for the die is also determined. For example, as described above, the yield map includes yield information of different products. Thus, the average yield for the die can be determined from the yield information of the product corresponding to the die. The predicted yield of the die to be used in determining whether the die is to be tested is then determined by multiplying the normalized predicted yield by the average yield for the die.

Although exemplary embodiments have been described, various modifications can be made without departing from the spirit and/or scope of the present invention. Therefore, the present invention should not be construed as being limited to the specific forms shown in the drawings and described above.

I claim:

1. A method of selecting dice to test on a wafer, the method comprising:
   (a) obtaining a yield map of the wafer, the yield map incorporating yield information of different products produced by a fabrication process, wherein the different products are produced using the same fabrication process;
   (b) generating a die placement based on the obtained yield map, wherein the die placement is for a product to be produced by the same process as used in producing the different products;
   (c) determining an expected yield for a die in the die placement based on the obtained yield map; and
   (d) determining whether to test the die in the die placement based on the expected yield for the die.

2. The method of claim 1, further comprising:
   generating a test pattern to be used in testing the dice in the die placement by iterating steps (c) and (d) for each die in the die placement.

3. The method of claim 1, further comprising:
   obtaining subsequent yield maps; and
   monitoring the fabrication process based on the subsequent yield maps.

4. The method of claim 1, wherein the yield information in the yield map are normalized yields of the different products, and wherein step c) includes:
   determining a normalized predicted yield for the die based on the yield map;
   determining an average yield for the die; and
   multiplying the normalized predicted yield by the average yield for the die to determine the predicted yield for the die.

5. The method of claim 1, wherein step (a) comprises:
   obtaining yield information of a first die that was formed on a first location on a first wafer;
   obtaining yield information of a second die that was formed on a second location on a second wafer,
   wherein the first die and second die are different products, and
   wherein a portion of the first location corresponds to a portion of the second location such that the portion of the first location would overlap with the portion of the second location if the first location was on the second wafer;
   defining a plurality of pixel elements, wherein each pixel element corresponds to a different location on a wafer, and wherein at least one of the plurality of pixel elements corresponds to the portion of the first location that corresponds to the portion of the second location;
   determining an average yield for the at least one of the plurality of pixel elements based on the yield information of the first die and the second die; and
   determining a deviation for the at least one of the plurality of pixel elements based on the average yield of the at least one of the plurality of pixel elements and the yield information of the first die and the second die.

6. The method of claim 5, wherein step (b) comprises:
   determining the die placement based on the plurality of pixel elements.

7. The method of claim 5, wherein step (c) comprises:
   determining the predicted yield based on the average yields and deviations of the plurality of pixel elements corresponding to the location of the die.

8. The method of claim 7, further comprising:
when the location of the die corresponds to two or more pixel elements, selecting the yield of the pixel element with the lowest deviation.

9. The method of claim 8, further comprising:
when the location of the die corresponds to two or more pixel elements and the deviations of the two or more pixel elements are the same or within a determined range, averaging the yields of the two or more pixel elements to determine the predicted yield of the die.

10. The method of claim 5, further comprising:
identifying locations of interest in the yield map; and
grouping pixel elements around each location of interest based on the average yield and deviation of the pixel elements.

11. The method of claim 10, wherein the locations of interest corresponds to a location on a wafer that interacts with a processing equipment used to process the wafer.

12. The method of claim 11, wherein the processing equipment includes a clamp, wafer scribe, wafer identification, or nitride injector.

13. The method of claim 11, further comprising:
grouping the locations of interest, wherein for the locations of interest in a group correspond to the locations on a wafer that interact with the same type of processing equipment.

14. The method of claim 13, further comprising:
when a die in the die placement in a location on the wafer corresponding to one of the locations of interest in a group is determined to be tested, selecting dice in the die placement in locations on the wafer corresponding to the other locations of interest in the same group to be tested.

15. The method of claim 13, further comprising:
when a change is detected in a grouping of pixel elements around a location of interest in a group of locations of interest, determining whether to test dice in the die placement in locations on the wafer corresponding to the locations of interest in the group.

16. The method of claim 15, wherein a subset of the dice in each group of locations of interest are selected to be tested to monitor the fabrication process.

17. The method of claim 1, wherein step (d) comprises:
comparing the determined expected yield for the die to a threshold yield; and
when the expected yield for the die meets or exceeds the threshold, selecting the die not to be tested.

18. A method of selecting dice to test on a wafer, the method comprising:
(a) obtaining a yield map of the wafer, the yield map incorporating yield information of different products produced by a fabrication process, wherein the different products are produced using the same fabrication process;
(b) generating a die placement based on the yield map, wherein the die placement is for a product to be produced by the same process as used in producing the different products;
(c) determining expected yields for each die in the die placement based on the yield map; and
(d) determining which dice in the die placement to test based on the expected yields.

19. The method of claim 18, further comprising:
generating a test pattern to be used in testing the dice in the die placement.

20. The method of claim 18, further comprising:
obtaining subsequent yield maps; and
monitoring the fabrication process based on the subsequent yield maps.

21. The method of claim 18, wherein step (a) comprises:
obtaining yield information of a first die that was formed on a first location on a first wafer;
obtaining yield information of a second die that was formed on a second location on a second wafer,
wherein the first die and second die are different products, and
wherein a portion of the first location corresponds to a portion of the second location such that the portion of the first location would overlap with the portion of the second location if the first location was on the second wafer;
defining a plurality of pixel elements, wherein each pixel element corresponds to a different location on a wafer, and wherein at least one of the plurality of pixel elements corresponds to the portion of the first location that corresponds to the portion of the second location;
determining an average yield for the at least one of the plurality of pixel elements based on the yield information of the first die and the second die; and
determining a deviation for the at least one of the plurality of pixel elements based on the average yield of the at least one of the plurality of pixel elements and the yield information of the first die and the second die.

22. The method of claim 21, wherein step (c) comprises:
determining the predicted yield based on the average yields and deviations of the plurality of pixel elements corresponding to the location of the die;
when the location of the die corresponds to two or more pixel elements, selecting the yield of the pixel element with the lowest deviation;
when the location of the die corresponds to two or more pixel elements and the deviations of the two or more pixel elements are the same or within a determined range, averaging the yields of the two or more pixel elements to determine the predicted yield of the die.

23. The method of claim 22, further comprising:
when the location of the die corresponds to two or more pixel elements, selecting the yield of the pixel element with the lowest deviation; and
when the location of the die corresponds to two or more pixel elements and the deviations of the two or more pixel elements are the same or within a determined range, averaging the yields of the two or more pixel elements to determine the predicted yield of the die.

24. The method of claim 23, wherein step (d) comprises:
comparing the expected yield for a die to a threshold yield; and
when the expected yield for the die meets or exceeds the threshold, selecting the die not to be tested.

25. The method of claim 21, further comprising:
identifying locations of interest in the yield map; and
grouping pixel elements around each location of interest based on the average yield and deviation of the pixel elements.

26. The method of claim 25, wherein the locations of interest corresponds to a location on a wafer that interacts with a processing equipment used to process the wafer.

27. The method of claim 26, wherein the processing equipment includes a clamp, wafer scribe, wafer identification, or nitride injector.

28. The method of claim 26, further comprising:
grouping the locations of interest, wherein for the locations of interest in a group correspond to the locations on a wafer that interact with the same type of processing equipment.

29. The method of claim 28, further comprising:
when a die in the die placement in a location on the wafer corresponding to one of the locations of interest in a group is determined to be tested, selecting dice in the die placement in locations on the wafer corresponding to the other locations of interest in the same group to be tested.

30. The method of claim 28, further comprising:
when a change is detected in a grouping of pixel elements around a location of interest in a group of locations of interest, determining whether to test dice in the die placement in locations on the wafer corresponding to the locations of interest in the group.

31. The method of claim 30, wherein a subset of the dice in each group of locations of interest are selected to be tested to monitor the fabrication process.

32. A system to select dice to test on a wafer, the system comprising:
a yield map incorporating yield information of different products produced by a fabrication process, wherein the different products are produced using the same fabrication process;
a die placement generated based on the yield map, wherein the die placement is for a product to be produced by the same process as used in producing the different products; and
a test pattern to be used in testing the dice in the die placement, the test pattern generated based on expected yields for each die in the die placement determined based on the yield map.

33. The system of claim 32, wherein the yield map is generated by:
obtaining yield information of a first die that was formed on a first location on a first wafer;
obtaining yield information of a second die that was formed on a second location on a second wafer,
wherein the first die and second die are different products, and
wherein a portion of the first location corresponds to a portion of the second location such that the portion of the first location would overlap with the portion of the second location if the first location was on the second wafer;
defining a plurality of pixel elements, wherein each pixel element corresponds to a different location on a wafer, and wherein at least one of the plurality of pixel elements corresponds to the portion of the first location that corresponds to the portion of the second location;
determining an average yield for the at least one of the plurality of pixel elements based on the yield information of the first die and the second die; and
determining a deviation for the at least one of the plurality of pixel elements based on the average yield of the at least one of the plurality of pixel elements and the yield information of the first die and the second die.

34. The system of claim 33, further comprising:
identifying locations of interest in the yield map, wherein the locations of interest corresponds to a location on a wafer that interacts with a processing equipment used to process the wafer; and
grouping pixel elements around each location of interest based on the average yield and deviation of the pixel elements.

35. The system of claim 34, wherein the processing equipment includes a clamp, wafer scribe, wafer identification, or nitride injector.

36. The system of claim 34, further comprising:
grouping the locations of interest, wherein for the locations of interest in a group correspond to the locations on a wafer that interact with the same type of processing equipment.

37. The system of claim 36, further comprising:
when a die in the die placement in a location on the wafer corresponding to one of the locations of interest in a group is determined to be tested, dice in the die placement in locations on the wafer corresponding to the other locations of interest in the same group are selected to be tested.

38. The system of claim 36, further comprising:
when a change is detected in a grouping of pixel elements around a location of interest in a group of locations of interest, determining whether to test dice in the die placement in locations on the wafer corresponding to the locations of interest in the group.

39. The system of claim 38, wherein a subset of the dice in each group of locations of interest are selected to be tested to monitor the fabrication process.

40. The system of claim 32, wherein the expected yield of a die in the die placement is compared to a threshold yield, and when the determined expected yield for the die meets or exceeds the threshold, the die is selected not to be tested.

* * * * *